United States Patent [19]

Kaptanoglu

[11] Patent Number: 5,448,185

[45] Date of Patent: Sep. 5, 1995

[54] PROGRAMMABLE DEDICATED FPGA FUNCTIONAL BLOCKS FOR MULTIPLE WIDE-INPUT FUNCTIONS

[75] Inventor: Sinan Kaptanoglu, San Carlos, Calif.

[73] Assignee: Actel Corporation, Sunnyvale, Calif.

[21] Appl. No.: 144,452

[22] Filed: Oct. 27, 1993

[51] Int. Cl.⁶ .......................................... H03K 19/173
[52] U.S. Cl. .......................................... 326/39; 326/41
[58] Field of Search .............................. 307/465–469, 307/465.1; 326/39, 41

[56] References Cited

U.S. PATENT DOCUMENTS

| | | | |
|---|---|---|---|
| 4,758,745 | 7/1988 | Elgamal et al. | 307/465 |
| 4,763,020 | 8/1988 | Takata | 307/465 |
| 4,771,285 | 9/1988 | Agrawal | 307/465 |
| 4,870,302 | 9/1989 | Freeman | 307/465 |
| 4,983,959 | 1/1991 | Breuninger | 307/465 |
| 5,028,821 | 7/1991 | Kaplinsky | 307/468 |
| 5,220,213 | 6/1993 | Chan | 307/465 |
| 5,245,227 | 9/1993 | Furtek | 307/465 |

*Primary Examiner*—David R. Hudspeth
*Assistant Examiner*—Andrew Sanders
*Attorney, Agent, or Firm*—D'Alessandro & Ritchie

[57] ABSTRACT

According to the present invention, a plurality of programmable multi-bit output functional block modules, each capable of assuming the functionality of one of the set of adders, subtracters, magnitude comparators, identity comparators, up/down counters, registers, multi-bit ANDs, and similar devices, are placed in predetermined locations of the FPGA chip. The number of functional blocks is much fewer than the number of FPGA modules on the chip. Each of the functional blocks has a plurality of inputs and outputs, each of which is capable of being connected to the neighboring programmable interconnect resources. Communication between and amongst functional blocks is carried out with the standard programmable resources available on board the FPGA chip.

13 Claims, 3 Drawing Sheets

PROGRAMMABLE DEDICATED FPGA FUNCTIONAL BLOCKS FOR MULTIPLE WIDE-INPUT FUNCTIONS

BACKGROUND OF THE INVENTION

1. Field of the Invention

This invention relates to the field of Field Programmable Gate Arrays (FPGAs). More particularly, it relates to a method and apparatus for improving the efficiency of FPGAs by inclusion of programmable dedicated multi-bit output functional blocks within FPGAs.

2. The Prior Art

FPGAs comprise a multitude of FPGA logic modules (the smallest programmable functional blocks on an FPGA) which in turn comprise a plurality of FPGA gates. FPGAs are user programmed to carry out desired functions. Examples of FPGAs are described in U.S. Pat. No. 4,758,745 to Elgamal et al. and U.S. Pat. No. 4,870,302 to Freeman, both of which are hereby incorporated herein by reference as if set forth fully herein.

Logic modules of FPGAs generally comprise multi-bit input, single-bit output devices which are programmable to create any desired output from a given input. This is accomplished in the prior art with multiplexer structures, look-up tables and logic gates, Logic modules are generally not programmable on the fly but are usually programmed by the user in a substantially permanent way.

While FPGAs present an excellent and extremely flexible method of dealing with the processing of various digital signals, a relatively large number of FPGA logic modules are typically required in order to fashion such typical multi-bit functional blocks as adders, subtracters, magnitude comparators, identity comparators, up/down counters, registers, and multi-bit AND gates. Typically, several of these functional blocks are used for every few thousand FPGA gates. Using current technology, this can require a great number of FPGA modules to be dedicated to providing the functionality of these predictably required functional blocks.

There are two major drawbacks to building these functional blocks out of FPGA logic modules: first, it uses more surface area or "real estate" on the chip than is absolutely necessary; second, the performance of functional blocks built out of FPGA logic modules is much lower than the performance of even corresponding ASIC standard cells configured to do the same thing.

Another method of providing the functionality of the aforementioned functional blocks is to provide some additional distributed capability which resides in each of (or at least in a large number of) the individual FPGA logic modules. These enhancements can then be combined with the basic capabilities of the FPGA logic module itself to construct functional blocks which deliver higher performance in a smaller area than permitted by simply configuring standard FPGA modules to perform these functions. The drawback here is that the added distributed capability is purchased at the cost of reduced flexibility and freedom available to the placement and routing programs which likely will reduce the performance of other portions of the FPGA. Examples of such approaches are found in the carry chain feature incorporated in the XC-4000 products of Xilinx, Inc. of San Jose, Calif. and the EPM-7000 product of Altera Corporation, of San Jose, Calif.

OBJECTS AND ADVANTAGES

Accordingly, it is an object of the present invention to provide an improved FPGA which is capable of providing the functionality of multi-bit output functional blocks such as adders, subtracters, magnitude comparators, identity comparators, up/down counters, registers, and multi-bit AND gates in reduced area with enhanced performance.

It is a further object of the present invention to provide an improved FPGA which provides a plurality of multi-bit output functional blocks capable of performing multi-bit output functions without requiring the use of FPGA logic modules.

It is a further object of the present invention to provide an FPGA having improved performance.

Yet a further object of the present invention is to provide an FPGA which requires less chip area to perform the same tasks as an FPGA not incorporating the advantages of the present invention.

These and many other objects and advantages of the present invention will become apparent to those of ordinary skill in the art from a consideration of the drawings and ensuing description of the invention.

SUMMARY OF THE INVENTION

According to the present invention, a plurality of programmable multi-bit output functional block modules, each capable of assuming the functionality of one of the set of adders, subtracters, magnitude comparators, identity comparators, up/down counters, registers, multi-bit AND gates, and similar devices, are placed in predetermined locations of the FPGA chip. The number of functional blocks is much fewer than the number of FPGA modules on the chip. Each of the functional blocks has a plurality of inputs and outputs, each of which is capable of being connected to the neighboring programmable interconnect resources. Communication between and amongst functional blocks is carried out with the standard programmable resources available on board the FPGA chip.

DESCRIPTION OF THE PREFERRED EMBODIMENTS

Figure 1:
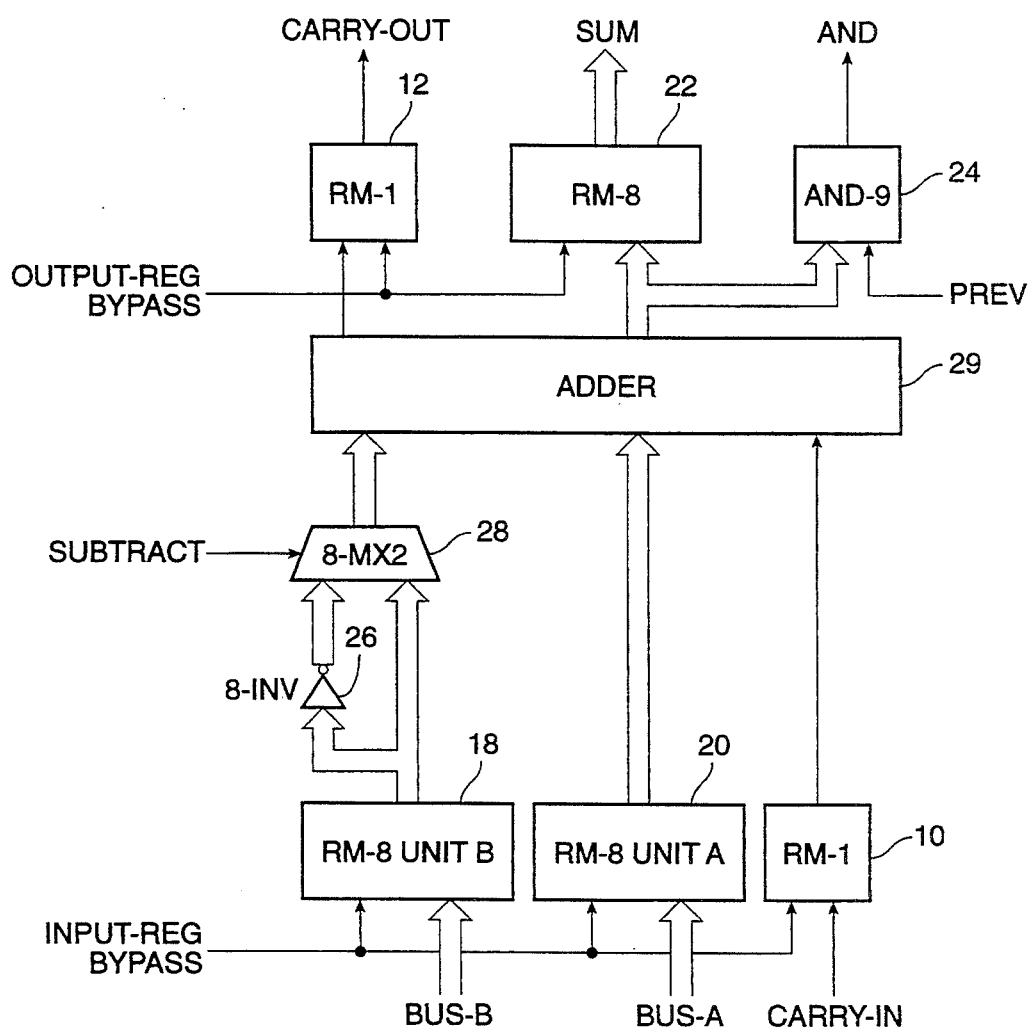
FIG. 1 is a schematic/block diagram of a multi-bit output functional block module according to a first preferred embodiment of the present invention.

Those of ordinary skill in the art will realize that the following description of the present invention is illustrative only and is not intended to be in any way limiting. Other embodiments of the invention will readily suggest themselves to such skilled persons from an examination of the within disclosure.

The present invention is directed to a method and apparatus for providing multi-bit output functional block modules on an FPGA without using more general single-bit output FPGA modules to achieve the same functionality.

While not comparable in flexibility to building functional blocks out of FPGA modules, the present invention provides functional blocks of much higher performance at much smaller cost in terms of silicon layout area consumed. When compared against providing some distributed capability in each (or most) FPGA modules, the performance of the present invention is higher, the area cost lower and the flexibility at least comparable.

The essence of the present invention is in designing a functional block module capable of a wide variety of often-needed multi-bit output functions and programmable using the general interconnect structure available on the FPGA.

The functional block modules that will be described below all perform operations that are 8-bits wide. In principle any number of bits may be chosen for the width of the operation. Depending on the target usage and market for a particular FPGA, 4, 6, 12 or even 16 bits may be more appropriate. The performance improves with wider blocks, but the cost also goes up since the probability of wasting a portion of the block also increases.

An 8-bit block can be used to implement one or more N-bit wide functions for all N, where N=1, 2, 3, ..., 8. If the desired function is wider than 8 bits, then several functional blocks can be combined and interconnected with the programmable interconnect structure of the FPGA to accommodate the desired size. To build a 13-bit wide adder, for example, one can simply use two blocks of 8-bit adders.

The functional blocks are not distributed to the FPGA modules. The size of the functional block, its shape, its circuit and the number of programmable inputs and outputs of such a functional block will be different from that of typical FPGA modules on the FPGA. Each functional block as a whole unit is located at a chosen location on the FPGA. The functional blocks have a multitude of inputs and outputs, each of which can be connected to the neighboring programmable interconnect resources. The communication among the functional blocks as well as between the functional blocks and the FPGA modules are done with the standard programmable interconnect resources available on the FPGA. In the case where there are more than one different type of programmable interconnection resource available, a selection can be made among them for various types. For example, the interconnection of two adders to each other to form a larger adder can (and should) have access to the fastest type of interconnect resources so as to maintain the highest (fastest) possible performance level.

Turning now to FIG. 1 a functional block module according to a first preferred embodiment of the present invention is depicted which is capable of performing any of the following 1 to 8 bit user selectable functions is depicted:

(a) adder;
(b) subtracter;
(c) magnitude comparator;
(d) identity comparator;
(e) up/down counter (the counter may count up or down as selected by the user, or it may count up and down depending upon the data inputs it receives);
(f) registers (the registers may be inverting or non-inverting and may have other desired functionality such as CLEAR, PRESET, ENABLE, etc.);
(g) AND gate;
(h) options (a), (b), (c) and (d) may be combined with any desired combination of input and/or output registers; and
(i) decoder.

The functional block shown in FIG. 1 is only one of many possible functional blocks. Furthermore, depending upon the intended range of applications, it may be preferable to divide the functionality of this block up into two or more separate functional blocks with programmable and high performance interconnect connecting them. For example, the functions (f), (g) and (h) can be easily separated from functions (a), (b), (c) and (d). In that case, functions (e) and (i) can still be performed by using interconnected combinations of these subblocks.

The functions above are selectable by appropriately configuring various inputs of the module to either logic 0 or logic 1. Importantly, all of the functions (except function (e)) can be selected "on the fly" by the value at the data inputs while the circuit is in operation. For example, the circuit can switch from an adder to a subtracter, or to an AND gate, depending on the data inputs. The function (e), however, involves interconnecting the outputs and the inputs of the functional block using the FPGA interconnect, and thus can not be converted to another function while the circuit is in operation.

Figure 2:
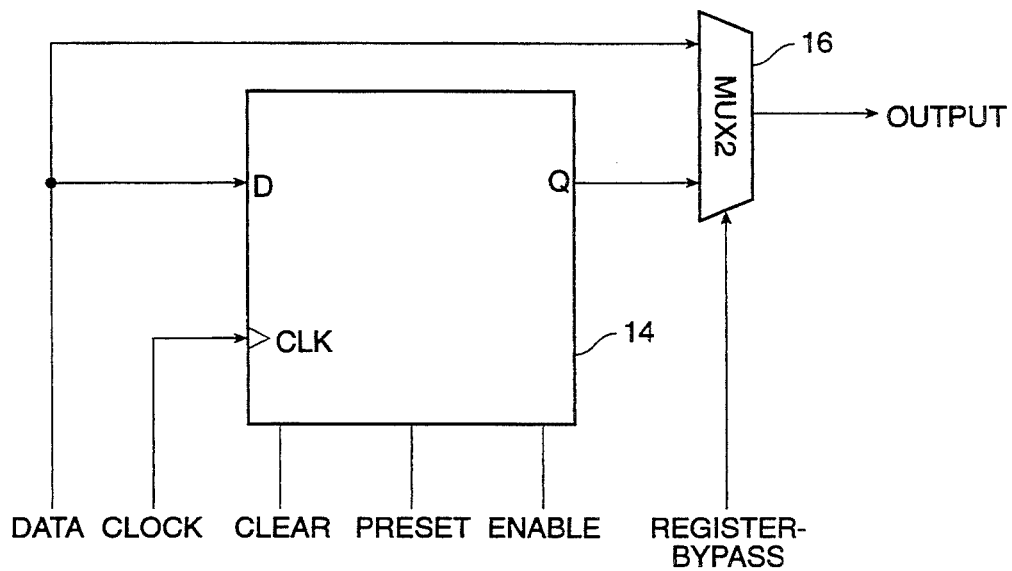
FIG. 2 is a schematic/block diagram of a multiplexer-register element used in the construction of the multi-bit output functional block modules according to the present invention.

As shown in FIG. 2, the blocks 10 and 12 of FIG. 1 (labelled "RM-1" in FIG. 1) are a combination of a register 14 and a multiplexer 16. This is shown in detail in FIG. 2. The register 14 is a simple D-flip-flop, but it may have additional features like CLEAR, PRESET, ENABLE and the like.

The blocks 18, 20 and 22 respectively labelled "RM-8 UNIT B" "RM-8 UNIT A" and "RM-8" in FIG. 1 are 8 bit wide parallel arrangements of the blocks RM-1, where the DATA inputs to each RM-1 are different, but the CLOCK and the REGISTER BYPASS inputs are common to all. If there are additional inputs for CLEAR, PRESET, ENABLE, and the like, they too are made common to all 8 RM-1 blocks within the RM-8 block.

The block 24 labelled "AND-9" in FIG. 1 is a simple 9-input AND gate.

The block 26 labelled "8-INV" in FIG. 1 is a bank of 8 parallel inverters which simply inverts the 8-bit wide signal.

The block 28 labelled "8-MX2" in FIG. 1 is a bank of 8 parallel 2-input multiplexers. The SELECT input for the multiplexers (named SUBTRACT) is common to all of them.

The block labelled "ADDER" is an 8-bit adder having two 8-bit inputs and a CARRY output. Such adders are well known to those of ordinary skill in the art.

In order to perform the functions listed above with this functional block, the data values needed at the inputs are shown in Table 1, below:

TABLE 1

| FUNCTION | BUS A | BUS B | CARRY IN | SUBTRACT | INPUT REGISTER BYPASS | OUTPUT REGISTER BYPASS | PREV |
|---|---|---|---|---|---|---|---|
| ADDER | DATA | DATA | DATA | 0 | DATA | DATA | X |
| SUBTRACTER | DATA | DATA | DATA | 1 | DATA | DATA | X |
| MAG COMP | DATA | DATA | 0 | 1 | DATA | DATA | X |
| IDENT COMP | DATA | DATA | 0 | 1 | DATA | X | DATA |
| UP COUNTER | START | 00000001 | 0 | 0 | 0 | 0 | X |
| DOWN COUNTER | START | 00000001 | 0 | 1 | 0 | 0 | X |
| REGISTER | DATA | 00000000 | 0 | 0 | DATA | $\overline{\text{DATA}}$ | X |
| INV REGISTER | 00000000 | DATA | 0 | 1 | DATA | $\overline{\text{DATA}}$ | X |
| AND GATE | DATA | 00000000 | 0 | 0 | DATA | X | DATA |
| DECODER | ADDR | DATA | 0 | 0 | 1 | 1 | X |

In Table 1, "DATA" means that the value can be any input value; $\overline{\text{DATA}}$ means the opposite value of the previous or the next column's DATA, whichever is applicable; "ADDR" means the address value that is to be decoded; and "X" means that the information is irrelevant.

Figure 3:
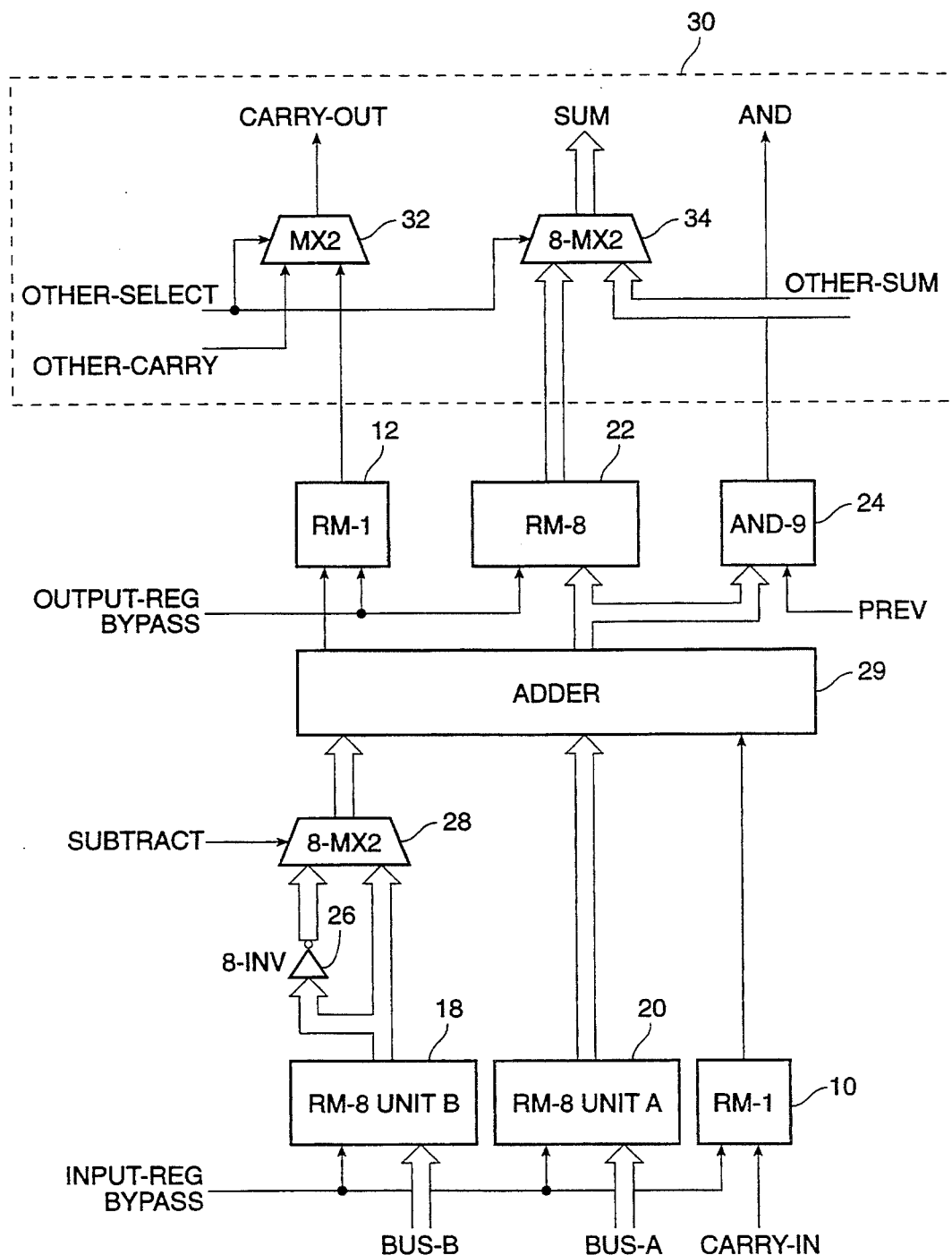
FIG. 3 is a schematic/block diagram of a multi-bit output functional block module according to a second preferred embodiment of the present invention.

When larger (more than 8 bits wide) functional blocks are built out of multiple units, several options may be exercised depending on the FPGA's intended speed and density. The simplest option is to interconnect multiple functional block units in series to get a bigger block. For example, one could build a 24 (or fewer) bit wide adder out of 3 units. This approach is the most cost effective, but it also yields the lowest performance. The performance degradation is linear with the number of units put together to build a bigger block. In order to avoid this option where desirable, the block 8-MX2 shown in FIG. 1 may be made available either as a separate (smaller) functional block, or else it could be included as part of the functional block shown in FIG. 3. FIG. 3 represents a second preferred embodiment of the present invention.

A second preferred embodiment of the present invention is depicted at FIG. 3. FIG. 3 represents the FIG. 1 embodiment to which is added the circuitry shown in box 30. In this case a 2-bit multiplexer 32 labelled "MX-2" is used to multiplex the CARRY OUT signal from RM-1 (12) with the OTHER-CARRY signal. Multiplexer 34 is an 8-bit wide parallel array of 2-bit multiplexers using OTHER-SELECT and multiplexing the SUM outputs from RM-8 (22) with OTHER-SUM.

The purpose of this additional circuitry is to permit such operations as parallel addition. For example, if it is desired to add numbers comprising more than 8 bits, say, two pairs of 8-bit numbers, by adding the lower order 8-bits in a first adder and by adding the higher order 8-bits in both a second adder and a third adder, the second adder assuming that the carry from the first adder will be zero and the third adder assuming that the carry from the first adder will be one, all three operations can be performed in parallel at the same time using the multiplexer at block 32 to select the appropriate higher order result. The cost is the use of additional functional blocks, but the elapsed time for the procedure is almost alved.

Figure 4:
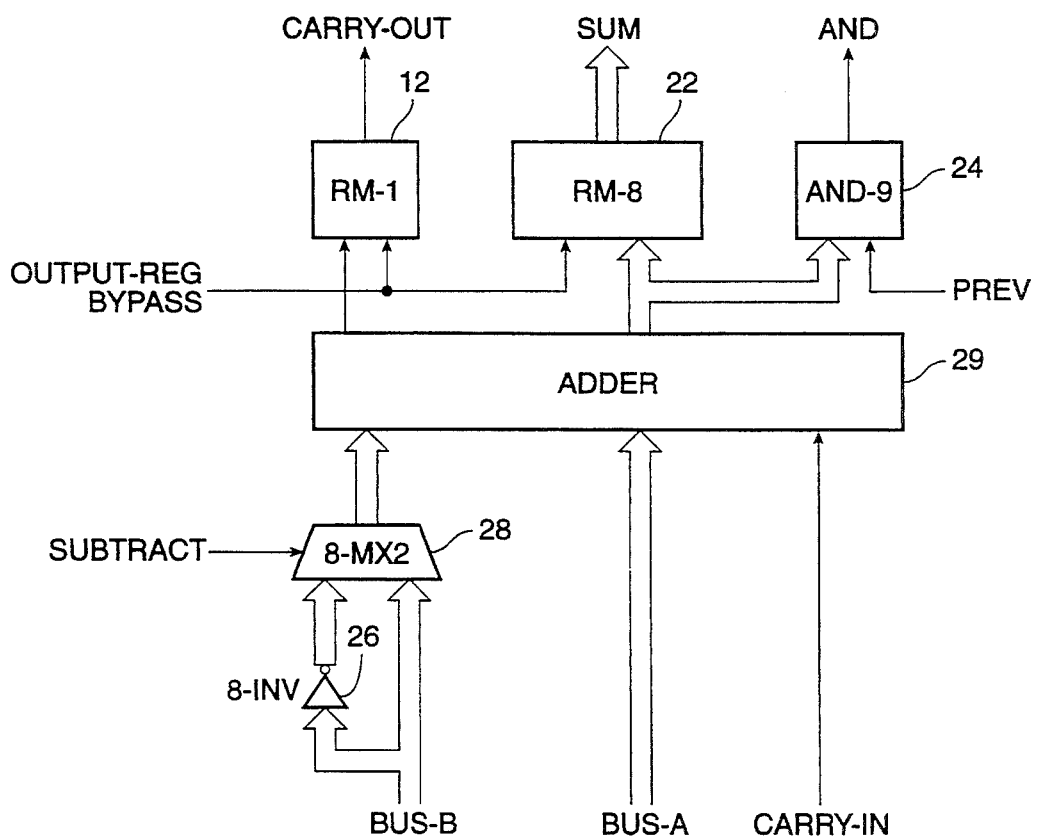
FIG. 4 is a schematic/block diagram of a multi-bit output functional block module according to a third preferred embodiment of the present invention.

FIG. 4 represents a third preferred embodiment of the present invention. FIG. 4 is similar to FIG. 1 except that the input registers have been omitted. Much of the functionality is retained, i.e., the FIG. 4 embodiment is capable of being programmed to perform the very same functions where the variety of register implementations are fewer, and pipelined adder/subtracter operation is not possible, yet the amount of real estate required is reduced by about 25% over the FIG. 1 embodiment for MUX-based (multiplexer-based) and anti-fuse connected FPGAs.

It is, of course, possible to build an FPGA which incorporates one or more of the functional block modules from the first, second and third preferred embodiments, or any subcombination thereof.

While illustrative embodiments and applications of this invention have been shown and described, it would be apparent to those skilled in the art that many more modifications than have been mentioned above are possible without departing from the inventive concepts set forth herein. The invention, therefore, is not to be limited except in the spirit of the appended claims.

What is claimed is:

1. A user programmable FPGA architecture disposed on an integrated circuit, said architecture comprising:
   a general interconnect structure;
   a plurality of FPGA logic modules, each of said FPGA logic modules including I inputs and J outputs;
   a plurality of functional block modules, each of said functional block modules including K inputs and L outputs, wherein K>I and L>J;
   said K inputs of each of said functional block modules including a first N-bit parallel input data bus and a second N-bit parallel input data bus and said L outputs of each of said functional block modules including an N-bit parallel output data bus wherein K≧2N and L≧N and N≧2 and wherein said functional block modules perform combinatorial operations on said first N-bit parallel input data bus and said second N-bit parallel input data bus in parallel to form an N-bit parallel output on said N-bit parallel output data bus.

2. A user programmable FPGA architecture disposed on an integrated circuit, said architecture comprising:
   a general interconnect structure;
   a plurality of FPGA logic modules, each of said FPGA logic modules including I inputs and J outputs;
   a plurality of functional block modules, each of said functional block modules including K inputs and L outputs, wherein K>I and L>J, said functional block modules adapted for performing combinatorial operations on a first N-bit data word and a second N-bit data word, for N≧2, provided by a corresponding first N-bit input data bus and a second N-bit input data bus, each of said functional block modules independently programmable to perform combinatorial functions including counter and comparator.

3. The user programmable FPGA architecture according to claim 2 wherein said functional block modules are programmable to perform said combinatorial functions based upon the states of a subset of said K inputs.

4. A user programmable FPGA architecture disposed on an integrated circuit, said architecture comprising:
   a general interconnect structure;
   a plurality of FPGA logic modules, each of said FPGA logic modules including I inputs and J outputs;
   a plurality of functional block modules, each of said functional block modules including K inputs and L outputs, wherein $K>I$ and $L>J$;
   said K inputs of each of said functional block modules including a first N-bit parallel input data bus and a second N-bit parallel input data bus and said L outputs of each of said functional block modules including an N-bit parallel output data bus wherein $K \geq 2N$ and $L \geq N$ and $N \geq 2$ and wherein said functional block modules perform combinatorial operations on said first N-bit parallel input data bus and said second N-bit parallel input data bus in parallel to form an N-bit parallel output on said N-bit parallel output data bus;
   said functional block modules each including an N-bit adder operatively connected to said first N-bit parallel input data bus and said second N-bit parallel input data bus, and
   an N-bit adder parallel output bus operatively connected to both an N+1 bit adder and an array of N 2-bit multiplexers;
   wherein each of said functional block modules is independently programmable to perform one of the functions selected from the group of adder and AND gate.

5. A user programmable FPGA architecture disposed on an integrated circuit, said architecture comprising:
   a general interconnect structure;
   a plurality of FPGA logic modules;
   a plurality of functional block modules for performing combinatorial operations on a first N-bit data word and a second N-bit data word, for $N \geq 2$, provided by a corresponding first N-bit input data bus and a second N-bit input data bus, each of said functional block modules independently programmable to perform one of the functions selected from the group of adder, subtracter, up-counter, down-counter, magnitude comparator, identity comparator, register, inverting register, AND gate, and decoder, said functional block modules including
      an N-bit adder operatively connected to said first N-bit input data bus and said second N-bit input data bus, and
      an N-bit adder output bus operatively connected to both an N+1 bit adder and an array of N 2-bit multiplexers.

6. A user programmable FPGA architecture disposed on an integrated circuit, said architecture comprising:
   a general interconnect structure;
   a plurality of FPGA logic modules;
   a plurality of functional block modules for performing combinatorial operations on a first N-bit data word and a second N-bit data word, for $N \geq 2$, provided by a corresponding first N-bit input data bus and a second N-bit input data bus, each of said functional block modules independently programmable to perform one of the functions selected from the group of adder, subtracter, up-counter, down-counter, magnitude comparator, identity comparator, register, inverting register, AND gate, and decoder, said functional block modules including
      a first array of N 2-bit multiplexers having an input connected to said first N-bit input data bus and an output connected to a first N-bit multiplexer output,
      a second array of N 2-bit multiplexers having an input connected to said second N-bit input data bus and an output connected to a second N-bit multiplexer output,
      an N-bit adder operatively connected to said first N-bit multiplexer output and said second N-bit multiplexer output, and
      an N-bit adder output bus operatively connected to both an N+1 bit adder and a third array of N 2-bit multiplexers.

7. A user programmable FPGA architecture disposed on an integrated circuit, said architecture comprising:
   a general interconnect structure;
   a plurality of FPGA logic modules;
   a plurality of functional block modules for performing combinatorial operations on a first N-bit data word and a second N-bit data word, for $N \geq 2$, provided by a corresponding first N-bit input data bus and a second N-bit input data bus, each of said functional block modules independently programmable to perform one of the functions selected from the group of adder, subtracter, up-counter, down-counter, magnitude comparator, identity comparator, register, inverting register, AND gate, and decoder, said functional block modules including
      a first array of N 2-bit multiplexers having an input connected to said first N-bit input data bus and an output connected to a first N-bit multiplexer output,
      a second array of N 2-bit multiplexers having an input connected to said second N-bit input data bus and an output connected to a second N-bit multiplexer output,
      an N-bit inverter having an inverter input and an inverter output, said inverter input operatively connected to said second N-bit multiplexer output,
      a third array of N 2-bit multiplexers having a first input connected to said inverter output, a second input connected to said second N-bit multiplexer output, and an N-bit output,
      an N-bit adder operatively connected to said first N-bit multiplexer output and said N-bit output of said third array of N 2-bit multiplexers, and
      an N-bit adder output bus operatively connected to both an N+1 bit adder and a fourth array of N 2-bit multiplexers.

8. A user programmable FPGA architecture disposed on an integrated circuit, said architecture comprising:
   a general interconnect structure;
   a plurality of FPGA logic modules;
   a plurality of functional block modules for performing combinatorial operations on a first N-bit data word and a second N-bit data word, for $N \geq 2$, provided by a corresponding first N-bit input data bus and a second N-bit input data bus, each of said functional block modules independently programmable to perform a combinatorial operation, said functional block modules including an N-bit adder operatively connected to said first N-bit input data bus and said second N-bit input data bus, and an N-bit adder output bus operatively connected to both an N+1 bit adder and an array of N 2-bit multiplexers.

9. A user programmable FPGA architecture disposed on an integrated circuit, said architecture comprising:

a general interconnect structure;

a plurality of FPGA logic modules;

a plurality of functional block modules for performing combinatorial operations on a first N-bit data word and a second N-bit data word, for N≧2, provided by a corresponding first N-bit input data bus and a second N-bit input data bus, each of said functional block modules independently programmable to perform a combinatorial operation, said functional block modules including a first array of N 2-bit multiplexers having an input connected to said first N-bit input data bus and an output connected to a first N-bit multiplexer output, a second array of N 2-bit multiplexers having an input connected to said second N-bit input data bus and an output connected to a second N-bit multiplexer output, an N-bit adder operatively connected to said first N-bit multiplexer output and said second N-bit multiplexer output, and an N-bit adder output bus operatively connected to both an N+1 bit adder and a third array of N 2-bit multiplexers.

10. A user programmable FPGA architecture disposed on an integrated circuit, said architecture comprising:

a general interconnect structure;

a plurality of FPGA logic modules;

a plurality of functional block modules for performing combinatorial operations on a first N-bit data word and a second N-bit data word, for N≧2, provided by a corresponding first N-bit input data bus and a second N-bit input data bus, each of said functional block modules independently programmable to perform a combinatorial operation, said functional block modules including a first array of N 2-bit multiplexers having an input connected to said first N-bit input data bus and an output connected to a first N-bit multiplexer output, a second array of N 2-bit multiplexers having an input connected to said second N-bit input data bus and an output connected to a second N-bit multiplexer output, an N-bit inverter having an inverter input and an inverter output, said inverter input operatively connected to said second N-bit multiplexer output, a third array of N 2-bit multiplexers having a first input connected to said inverter output, a second input connected to said second N-bit multiplexer output, and an N-bit output, an N-bit adder operatively connected to said first N-bit multiplexer output and said N-bit output of said third array of N 2-bit multiplexers, and an N-bit adder output bus operatively connected to both an N+1 bit adder and a fourth array of N 2-bit multiplexers.

11. A user programmable FPGA architecture according to claim 1 wherein N≧4.

12. A user programmable FPGA architecture according to claim 1 wherein N≧8.

13. A user programmable FPGA architecture according to claim 1 wherein each of said functional block modules further comprises:

an N-bit adder operatively connected to said first N-bit parallel input data bus and said second N-bit parallel input data bus, and an N-bit adder parallel output bus operatively connected to both an N+1 bit adder and an array of N 2-bit multiplexers.

* * * * *